United States Patent
Horng et al.

(10) Patent No.: US 6,979,582 B2
(45) Date of Patent: Dec. 27, 2005

(54) VERTICAL-CAVITY SURFACE EMITTING LASER DIODE AND METHOD FOR PRODUCING THE SAME

(75) Inventors: Ray-Hua Horng, Taichung (TW); Dong-Sing Wu, Taichung (TW)

(73) Assignee: National Chung-Hsing University, Taichung (TW)

(*) Notice: Subject to any disclaimer, the term of this patent is extended or adjusted under 35 U.S.C. 154(b) by 141 days.

(21) Appl. No.: 10/668,553

(22) Filed: Sep. 22, 2003

(65) Prior Publication Data

US 2005/0063437 A1 Mar. 24, 2005

(51) Int. Cl.7 .............................................. H01L 21/00
(52) U.S. Cl. ........................... 438/27; 438/29; 438/32; 438/38; 438/47; 438/FOR 157; 438/FOR 287; 257/E31.099; 257/E31.105; 257/83; 362/84; 362/612; 362/800; 372/98; 372/103; 250/214; 250/552
(58) Field of Search ............................. 438/27, 29, 32, 438/38, 47, FOR 157, FOR 287; 257/83, 257/E31.099, E31.105; 372/98, 103; 362/84, 362/612, 800; 250/214, 552

(56) References Cited

U.S. PATENT DOCUMENTS

| 2003/0081642 A1 | * | 5/2003 | Hwang et al. | 372/45 |
| 2003/0185267 A1 | * | 10/2003 | Hwang et al. | 372/96 |
| 2004/0151221 A1 | * | 8/2004 | Yamamoto et al. | 372/32 |
| 2005/0013334 A1 | * | 1/2005 | Watanabe et al. | 372/44 |

FOREIGN PATENT DOCUMENTS

| JP | 62179179 A | * | 8/1987 | H01L 33/00 |
| JP | 06097499 A | * | 4/1994 | H01L 33/00 |

\* cited by examiner

Primary Examiner—George Fourson
Assistant Examiner—Thanh V. Pham
(74) Attorney, Agent, or Firm—Charles E. Baxley

(57) ABSTRACT

The present invention provides a vertical-cavity surface emitting laser (VCSEL) diode and a method for producing the same. In this method, an n-type and a p-type ohmic contact electrodes are previously disposed, and then two pairs of distributed Bragger reflectors (DBRs) are formed. At last, a permanent metal substrate is plated. According to the present invention, reflectivity of the DBRs can be preserved without damage during rapid thermal annealing, and thus brightness of the laser diode is improved.

15 Claims, 4 Drawing Sheets

VERTICAL-CAVITY SURFACE EMITTING LASER DIODE AND METHOD FOR PRODUCING THE SAME

BACKGROUND OF THE INVENTION

1. Field of the Invention

The present invention relates to a laser diode and a method for producing the same, in particular, to a vertical-cavity surface emitting laser diode and a method for producing the same.

2. Description of the Related Art

For conventional vertical-cavity surface emitting laser (VCSEL) diode, the cavities of distributed Bragg reflectors (DBR) can be formed by epitaxial growth. In general, reflectivity of the DBR higher than 99% is required. To obtain such reflectivity, appropriate pair numbers of DBRs with appropriate refractive index deviation ($\Delta n$) are provided. For VCSEL devices of wavelength at 1,310 or 1,550 nm, only the InGaAsP/InP Bragg mirror grown on an active layer of InP series is considered. However, heat dissipation of the InGaAsP/InP mirror is poor and $\Delta n$ thereof is too small when compared with GaAs/AlAs or dielectric Bragg mirrors. Therefore, lots of Bragg reflector pairs are associated to achieve desired reflectivity. As a result, complicated epitaxial processes including thousands of MBE or MOCVD during at least 4–8 hours is necessary. In addition, to maintain growth deviation of production less than 1% is very hard for manufacturing.

The above problems may be solved by applying direct wafer-bonding technology once or twice during manufacturing. For example, a laser diode of wavelength at 1,310 nm can be obtained by bonding an epitaxial structure to a GaAs substrate on which another epitaxial AlGaAs/GaAs DBR structure is grown. Such processes need an epitaxial system complying requirement of lattice matching which is not necessary for VCSEL epitaxial system. However, direct wafer-bonding needs to be performed at high temperature and through lattice alignment, which significantly limit production yields and increase manufacturing cost.

Therefore, it's desirable to find a laser diode and a method for producing the same to overcome the above disadvantages.

SUMMARY OF THE INVENTION

The object of the present invention is to provide a vertical-cavity surface emitting laser diode, which includes Bragg mirrors with superior reflectivity.

Another object of the present invention is to provide a method for producing the above laser diode, which is easily achieved and needs low cost.

To produce the laser diode of the present invention, a substrate is first provided for sequentially epitaxying an n-type cladding layer, an active layer with quantum well structure and a p-type cladding layer thereon. The p-type cladding layer, the active layer and an upper portion of the n-type cladding layer are partially etched so as to expose the n-type cladding layer. Lateral surface of the p-type cladding layer is then oxidized to obtain a surrounding insulating area by wet oxidation. Next, an n-type ohmic contact electrode is deposited on the exposed n-type cladding layer, and an annular p-type ohmic contact electrode is deposited on the p-type cladding layer close to the insulating area. An upper DBR pair of dielectric material is then deposited on the p-type cladding layer at least within the annular p-type ohmic contact electrode. A bottom DBR pair of dielectric material is deposited beneath the n-type cladding layer. A glass substrate is then bonded to the upper DBR pair and the substrate aforementioned is removed. A permanent substrate is then plated beneath a metal conductive layer which is previously deposited beneath the bottom DBR pair. At last, the glass substrate is removed.

In accordance with the above method, a vertical-cavity surface emitting laser (VCSEL) diode is obtained. The VCSEL diode primarily includes an n-type cladding layer, an active layer, a p-type cladding layer, an insulating area, an n-type ohmic contact electrode, an annular p-type ohmic contact electrode, an upper DBR pair, a bottom DBR pair, a metal conductive layer and a permanent substrate. The n-type cladding layer has a top surface being partially etched. The active layer has a quantum well structure and is formed on the un-etched surface of the n-type cladding layer. The p-type cladding layer is formed on the active layer. The insulating area is formed surrounding the p-type cladding layer. The n-type ohmic contact electrode is deposited on the etched surface of the n-type cladding layer. The annular p-type ohmic contact electrode is deposited on the p-type cladding layer close to the insulating area. The upper DBR pair is made of dielectric material and formed on the p-type cladding layer at least within the annular p-type ohmic contact electrode. The bottom DBR pair is also made of dielectric material and formed beneath the n-type cladding layer. The metal conductive layer is formed beneath the bottom DBR pair. The permanent substrate is formed beneath the metal conductive layer.

Moreover, a spacer without shading the emitted light can be formed between the bottom DBR pair and the n-type cladding layer by appropriately applying photolithographic techniques. Similarly, the metal substrate is plated only where corresponding to the spacer, so that light beams can be transmitted from the bottom DBR pair.

DETAILED DESCRIPTION OF THE PREFERRED EMBODIMENTS

Figure 1:
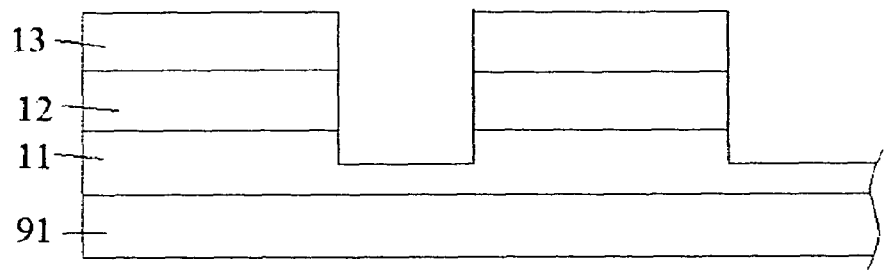
FIGS. 1–7 illustrate cross sections of the first embodiment during manufacturing.

FIGS. 1–7 illustrate cross sections of the first embodiment during manufacturing. In FIG. 1, an InP substrate 91 is provided for sequentially epitaxy an n-type cladding layer 11, an active layer with quantum well structure 12 and a p-type cladding layer 13 thereon. In this embodiment, both electrodes are formed at the top side. Therefore, according to size of each laser diode die, the p-type cladding layer 13, the active layer 12 and an upper portion of the n-type cladding layer 11 are partially etched. As a result, trenches deep to the n-type cladding layer 11 are formed as shown in FIG. 1.

Figure 2:
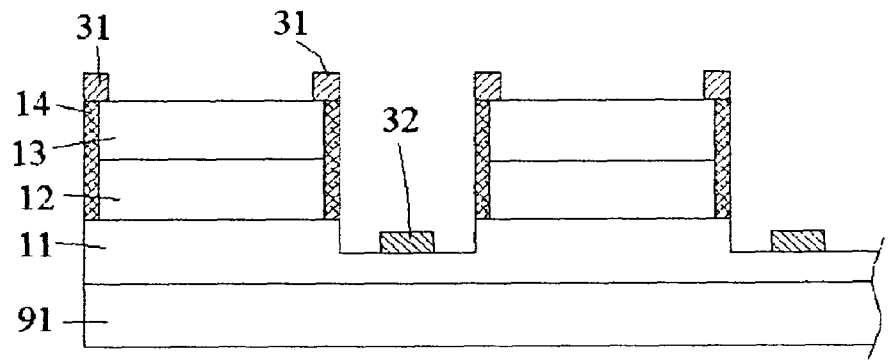

In FIG. 2, lateral surface of the p-type cladding layer 13 and the active layer 12 along the trenches are oxidized by wet oxidation to form an surrounding insulating area 14 for each laser diode die. For each laser diode die, an annular p-type ohmic contact electrode 31 is then disposed on the top edges of the p-type cladding layer 13 close to the insulating area 14, and an n-type ohmic contact electrode 32 is disposed on the exposed n-type cladding layer 11, i.e., bottom of the trenches aforementioned. The electrodes 31, 32 can be formed on predetermined positions by a lift-off process, and then generate ohmic contact interfaces with the semiconductor layer by rapid thermal annealing above 350° C.

Figure 3:
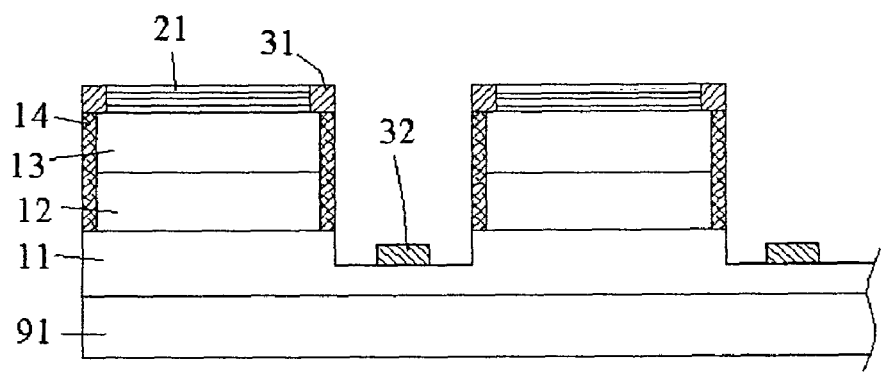

FIG. 3 illustrates an upper DBR pair 21 coated on the p-type cladding layer 14 and within the annular p-type ohmic contact electrode 31. Sputtering is preferably applied for completing the DBR pair due to suitable coating rate and adhesion effect. Particularly, the DBR pair is deposited after annealing, and therefore reflectivity thereof can be preserved without damage.

Figure 4:
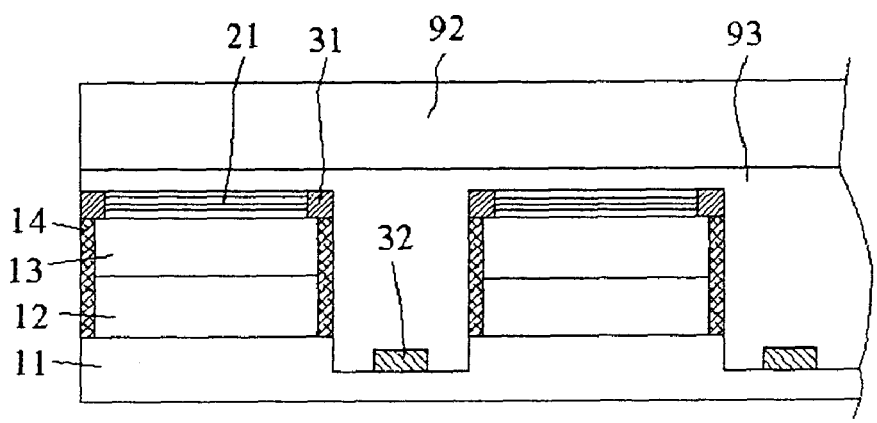

FIG. 4 shows that a glass substrate 92 coated with wax 93 is bonded to the top surface of the wafer, and associated with the upper DBR pair 21 and the ohmic contact electrodes 31, 32. By supporting the epitaxial structure with the glass substrate 92, the InP substrate 91 is no longer necessary and can be removed by chemical mechanical polishing or etching. The n-type cladding layer 11 is thus exposed.

Figure 5:
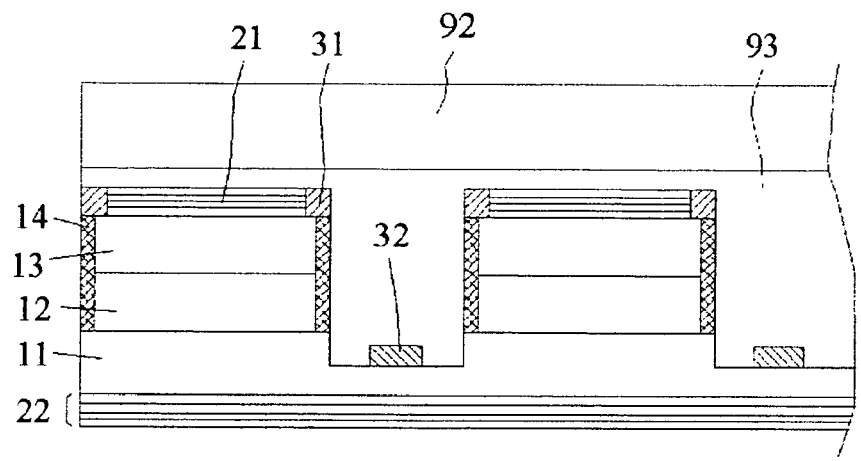

FIG. 5 shows a bottom DBR pair 22 is coated beneath the n-type cladding layer 11 by sputtering. In the present invention, both the DBR pairs 21, 22 are made from dielectric material, for example, $ZnSe/MgF_2$, $SiO_2/Si$, $Si_3N_4/Si$, $TiO_2/Si$, $Ta_2O_5/Si$, $HfO_2/SiO_2$, $Ta_2O_5/SiO_2$, $ZrO_2/SiO_2$. $TiO_2/SiO_2$.

Figure 6:
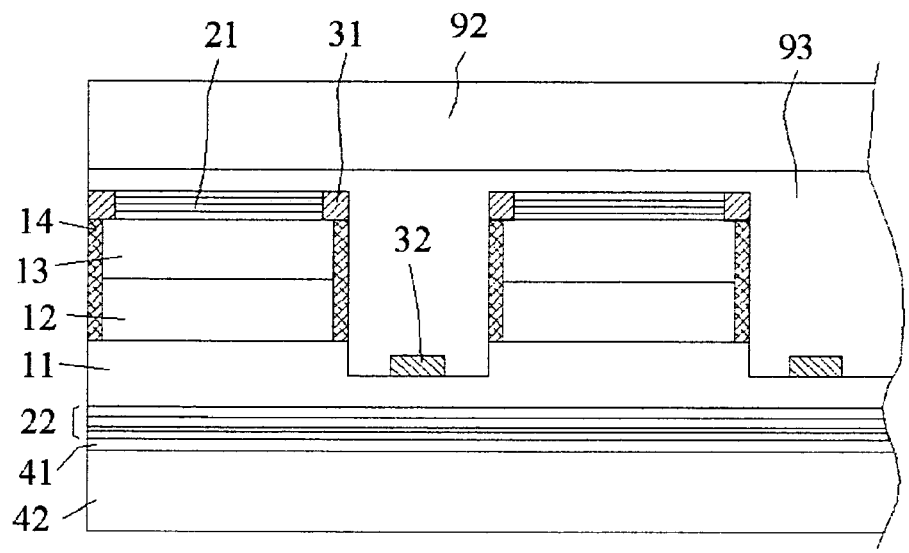

To enhance heat dissipation of the laser diode, a metal permanent substrate 42 is plated beneath a metal conductive layer 41 which is previously deposited beneath the DBR pair 22 as shown in FIG. 6. The plating process can be completed in an electrolyte containing $Cu^{+2}$, to obtain a stable copper substrate 42. The glass substrate 92 used for temporarily supporting the structure can be then removed by melting the wax 93 below 100° C. At last, a laser diode die as shown in FIG. 7 is obtained after dicing.

Figure 8:
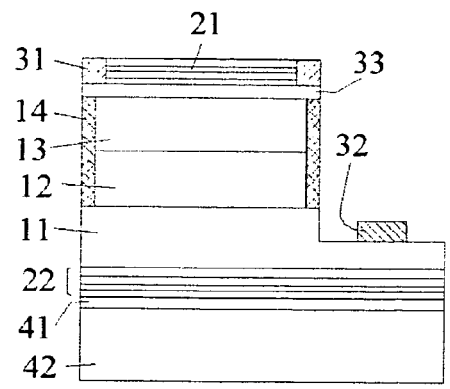
FIG. 8 illustrates the structure of the first embodiment with an additional transparent conductive film.

FIG. 8 shows that an additional transparent conductive film 33 of ITO material is deposited between the p-type cladding layer 13 and the p-type ohmic contact electrode 31 to enhance current spreading.

Figure 7:
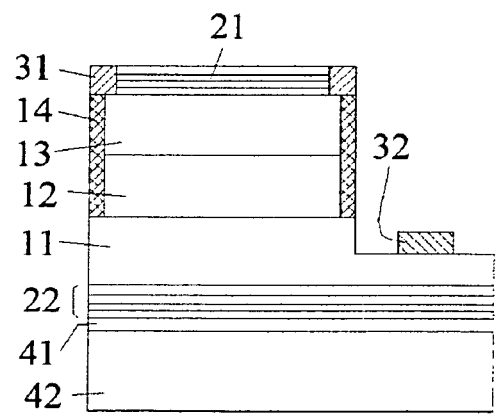
Figure 9:
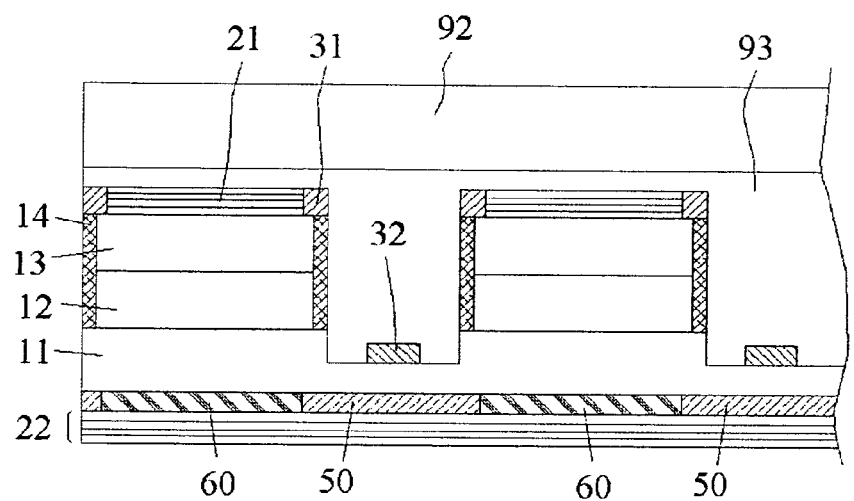
FIGS. 9–11 illustrate cross sections of the second embodiment different from the first embodiment during manufacturing.
Figure 10:
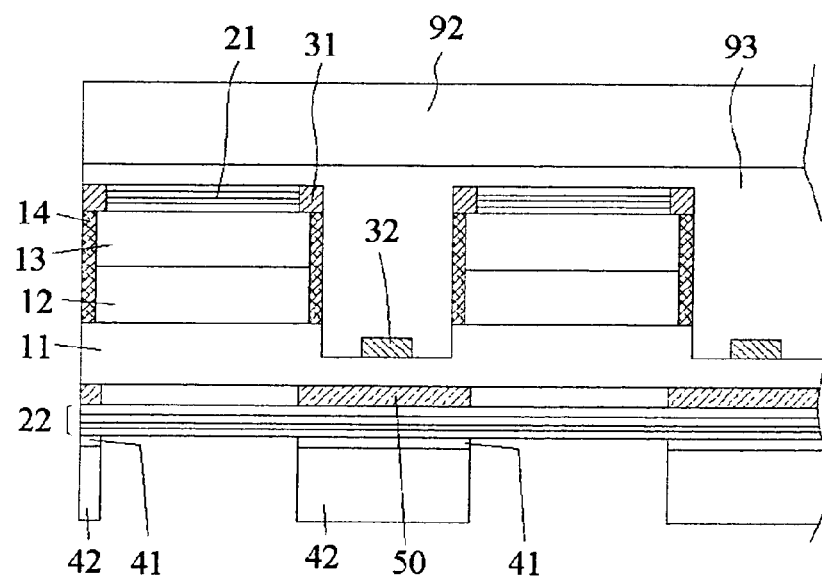
Figure 11:
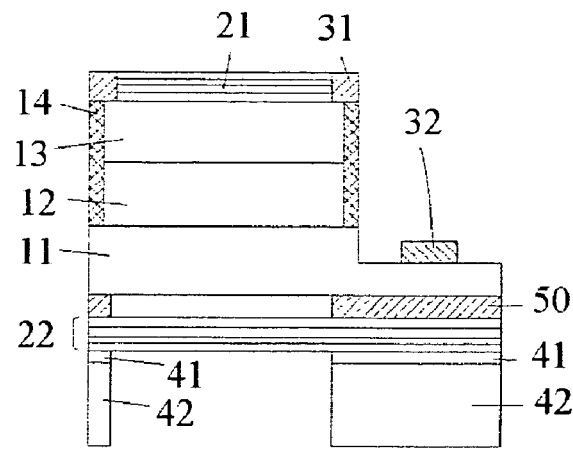

For the laser diode of FIGS. 7 and 8, light is emitted out through the upper DBR pair 21. The present invention also provides another embodiment in which light is emitted out through the bottom DBR pair 22. FIGS. 9–11 illustrate cross sections of such laser diode different from the first embodiment during manufacturing.

FIG. 9 shows a photoresist layer 60 and an insulating layer 50 are coated beneath the n-type cladding layer 11 after the InP substrate 91 is removed. The photoresist layer 60 is coated where mainly corresponding to the active layer 12. The insulating layer 50 is deposited on other bottom surface of the cladding layer 11, i.e., opposite bottom edges of the n-type cladding layer 11 as shown in FIG. 9.

The bottom DBR pair 22 is then deposited beneath the photoresist layer 60 and the insulating layer 50. After the photoresist layer 60 is removed, a spacer formed by the insulating layer 50 is obtained, as shown in FIG. 10. Next, the metal conductive layer 41 is deposited beneath the bottom DBR pair 22 corresponding to the insulating layer 50; and the copper substrate 42 is plated beneath the metal conductive layer 41. Accordingly, light passing through the bottom DBR pair 22 will not be shaded by the metal conductive layer 41 and the copper substrate 42.

In like manner, the wafer is diced after removing the glass substrate 92, and a laser diode as shown in FIG. 11 is obtained.

Furthermore, by applying a voltage to the substrate 42 and the electrode 32 of the second embodiment, wavelength of the laser diode can be modulated by an electrostatics means.

Figure 12:
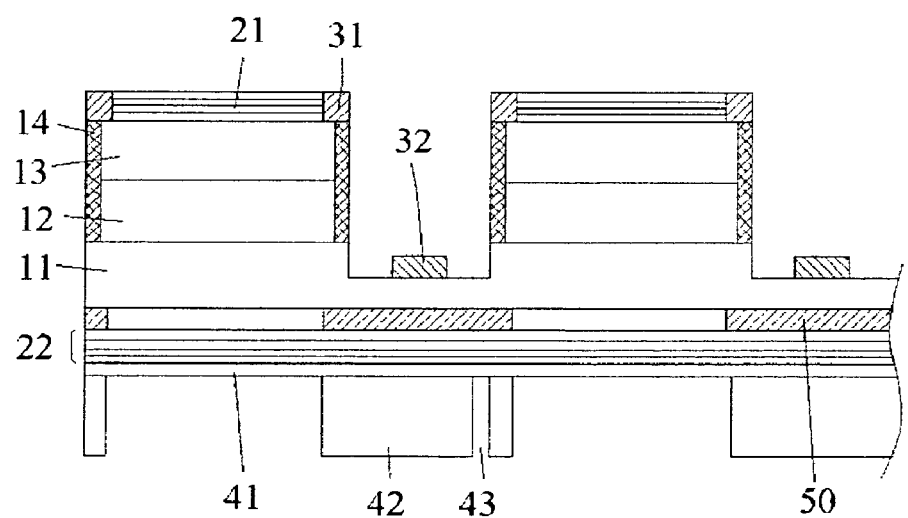
FIG. 12 illustrates the second embodiment having a plated permanent substrate without shading scrub lines.

In the present invention, the substrate 42 is not necessarily plated through the bottom surface of the diode. Scrub lines 43 of the wafer can be optionally exposed as shown in FIG. 12, so that wafer dicing can be performed conveniently.

According to description of the preferred embodiments, advantages of the present invention can be roughly summarized as follows:

a) production cost is low and the laser diode retains good light-emitting efficiency;

b) processes are easily completed by providing the DBR pairs of dielectric material (or companied with metal mirrors); and c) heat dissipation of the diode is promoted by plating the metal permanent substrate, which also facilitates preserving the DBRs without damage.

What is claimed is:

1. A method for producing a vertical-cavity surface emitting laser diode, comprising steps of:
    a) sequentially epitaxying an n-type cladding layer, an active layer with quantum well structure and a p-type cladding layer on a substrate;
    b) partially etching said p-type cladding layer, said active layer and an upper portion of said n-type cladding layer to expose a part of said n-type cladding layer;
    c) oxidizing lateral surface of said p-type cladding layer by wet oxidation to form an insulating area;
    d) disposing an annular p-type ohmic contact electrode on said p-type cladding layer close to said insulating area, and disposing and an n-type ohmic contact electrode on said exposed n-type cladding layer;
    e) depositing an upper DBR pair of dielectric material on said p-type cladding layer at least within said p-type ohmic contact electrode;
    f) bonding a glass substrate upon said upper DBR pair;
    g) removing said substrate provided in step a);
    h) depositing a bottom DBR pair of dielectric material beneath said n-type cladding layer;
    i) disposing a metal conductive layer beneath said bottom DBR pair;
    j) plating a permanent substrate beneath said metal conductive layer; and
    k) removing said glass substrate.

2. The method as claimed in claim 1, wherein said substrate of step a) is an InP substrate.

3. The method as claimed in claim 1, wherein said substrate of step a) is a GaAs substrate.

4. The method as claimed in claim 1, wherein said substrate of step a) is a Al2O3 sapphire substrate.

5. The method as claimed in claim 1, wherein said upper DBR pair is a metal reflective layer.

6. The method as claimed in claim 1, wherein said bottom DBR pair is a metal reflective layer.

7. The method as claimed in claim 1, wherein said upper DBR pair is coated within said p-type ohmic contact electrode.

8. The method as claimed in claim 1, wherein said upper DBR pair is made from a material selected from the group consisting of $ZnSe/MgF_2$, $SiO_2/Si$, $Si_3N_4/Si$, $TiO_2/Si$, $Ta_2O_5/Si$, $HfO_2/SiO_2$, $Ta_2O_5/SiO_2$, $ZrO_2$, $/SiO_2$, $TiO_2/SiO_2$.

9. The method as claimed in claim 1, wherein said glass substrate is bonded to said upper DBR pair and said p-type ohmic contact electrode by being previously coated with wax therebeneath.

10. The method as claimed in claim 1, wherein said substrate of step a) is removed by chemical mechanical polishing.

11. The method as claimed in claim 1, wherein said substrate of step a) is removed by etching.

12. The method as claimed in claim 1, wherein said bottom DBR pair is formed beneath said n-type cladding layer by coating.

13. The method as claimed in claim 1, wherein said bottom DBR pair is made from a material selected from the group consisting of $ZnSe/MgF_2$, $SiO_2/Si$, $Si_3N_4/Si$, $TiO_2/Si$, $Ta_2O_5/Si$, $HfO_2/SiO_2$, $Ta_2O_5/SiO_2$, $ZrO_2$, $/SiO_2$, $TiO_2/SiO_2$.

14. The method as claimed in claim 1 further depositing a transparent conductive film on said p-type ohmic contact electrode.

15. The method as claimed in claim 1 further comprising step g') and step h') respectively after said step g) and step h), and thus steps g'), h), h') and i) being as follows:
   g') disposing a photoresist layer on a part of bottom surface of said n-type cladding layer mainly corresponding to said active layer, and disposing an insulating layer on the other bottom surface of said n-type cladding layer;
   h) depositing a bottom DBR pair beneath said photoresist layer and said insulating layer;
   h') removing said photoresist layer;
   i) disposing a metal conductive layer beneath said bottom DBR pair corresponding to said insulating layer.

* * * * *